United States Patent
Hansquine (12) 
(10) Patent No.: US 6,278,715 B1
(45) Date of Patent: Aug. 21, 2001

(54) SYSTEM AND METHOD FOR REDUCING DEINTERLEAVER MEMORY REQUIREMENTS THROUGH CHUNK ALLOCATION

(75) Inventor: David Hansquine, San Diego, CA (US)

(73) Assignee: Qualcom Incorporated, San Diego, CA (US)

( * ) Notice: Subject to any disclaimer, the term of this patent is extended or adjusted under 35 U.S.C. 154(b) by 0 days.

(21) Appl. No.: 09/187,686

(22) Filed: Nov. 5, 1998

(51) Int. Cl.[7] .................................................... H04L 12/54
(52) U.S. Cl. ............................................ 370/428; 370/412
(58) Field of Search .................................... 370/428, 412, 370/413, 415, 417, 394, 393, 329, 419, 420, 429; 375/246, 353, 262, 265, 341, 372; 714/755, 756, 759, 760, 766, 784, 791, 793, 795

(56) References Cited

U.S. PATENT DOCUMENTS

| | | | | |
|---|---|---|---|---|
| 5,598,432 | * | 1/1997 | Wei ........................................ | 375/229 |
| 5,710,783 | * | 1/1998 | Luthi et al. ............................ | 714/755 |
| 5,761,249 | * | 6/1998 | Ben-Efraim ........................... | 375/341 |
| 5,784,392 | * | 7/1998 | Czaja et al. ........................... | 714/786 |
| 6,012,159 | * | 1/2000 | Fischer et al. ........................ | 714/755 |
| 6,088,387 | * | 7/2000 | Gelblum et al. ...................... | 375/222 |
| 6,094,465 | * | 7/2000 | Stein et al. ............................ | 375/346 |

FOREIGN PATENT DOCUMENTS

| | | |
|---|---|---|
| 0660558 | 6/1995 | (EP) . |
| 0681373 | 11/1995 | (EP) . |
| 0715432 | 6/1996 | (EP) . |

OTHER PUBLICATIONS

H. Huang and Chih–Lin I: "Combined Pilot Multipath Noise Cancellation and Partial Decorrelation for Coherent Multicode CDMA Receivers," IEEE Global Telecommunications Conference, Nov. 3–8, 1997, pp. 904–909.

H.M. Kwon, S. Ratanamahatana, J.H. Shim: "One Viterbi Decoder with Data Rate Estimation for IS–95 CDMA Wireless Communications," IEEE Global Telecommunications Conference, Nov. 3–8, 1997, pp. 594–598.

* cited by examiner

Primary Examiner—Dang Ton
Assistant Examiner—Phirin Sam
(74) Attorney, Agent, or Firm—Philip R. Wadsworth; Thomas R. Rouse; Raymond B. Hom (57) ABSTRACT

A voice and data communication system and method for receiving symbols for a plurality of channels into chunks included within buffers, each chunk holding symbols for only a corresponding one of the plurality of channels. As complete frames are received and decoded, the chunks holding the symbols, that are decoded, are freed up to be used for reception of newly arriving symbols included in newly arriving frames.

24 Claims, 6 Drawing Sheets

FIG. 6

SYSTEM AND METHOD FOR REDUCING DEINTERLEAVER MEMORY REQUIREMENTS THROUGH CHUNK ALLOCATION

BACKGROUND OF THE INVENTION

1. Field of the Invention

The present invention relates in general to voice and data communications. In particular, the invention pertains to deinterleaving and decoding symbols received over a plurality of channels.

2. Description of the Related Art

A periodic stream of symbols is received by a deinterleaver and output to a decoder which processes the received symbols. If the deinterleaver deinterleaves the n symbols received during a frame period, then n symbols need to be received by the deinterleaver before being processed by the decoder. A typical bit-reversal deinterleaver would take the n symbols and write them into a two-dimensional table, row by row, and then read the n symbols out column by column, or vice versa. As a result, if the decoder needs to operate on the deinterleaved symbols in order, then typically, the deinterleaver must wait until almost all of the n symbols have been received. Thus, effectively, a periodic stream of symbols must be buffered in one place and then provided to the decoder when the n symbols have been received.

While the decoder is processing a buffer of n symbols, more symbols are being received by the deinterleaver. Therefore, the potential exists to overwrite symbols that have not yet been processed by the decoder. Known systems solve this problem by double-buffering the received symbols.

Figure 1:
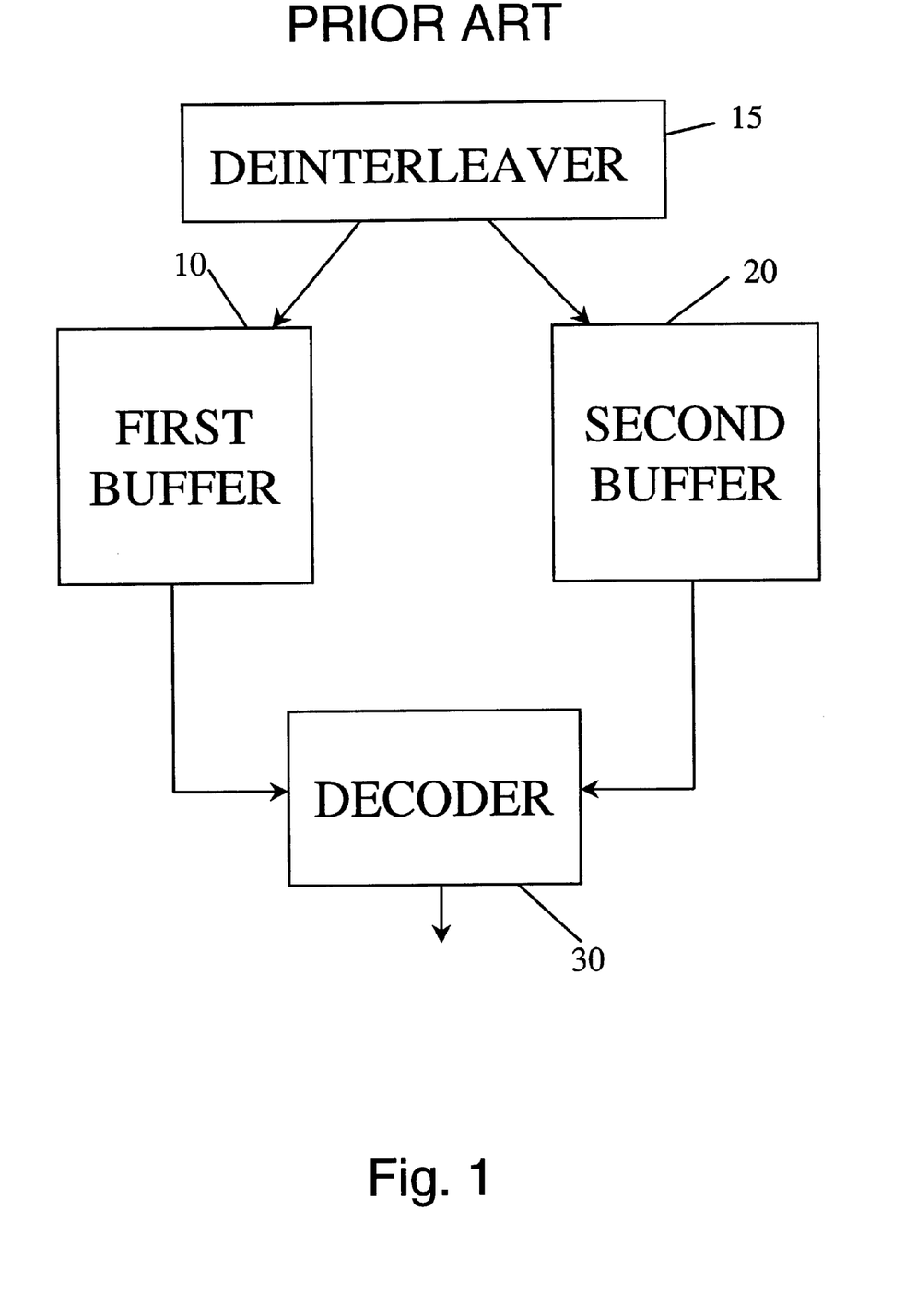
FIG. 1 shows a double-buffered system for the reception of symbols from deinterleavers.

FIG. 1 shows a first buffer 10 and a second buffer 20 in a known system for deinterleaving and decoding symbols received during frame periods, n symbols being received during each frame period. Each buffer can store up to n symbols. When the symbols are first received from a deinterleaver 15, n symbols are stored in, for example, first buffer 10. After n symbols are received, the n symbols in first buffer 10 are then processed by a decoder 30. However, while decoder 30 decodes the n symbols, a stream of symbols continues to be received by the deinterleaver. If the symbols are stored in first buffer 10 before the decoder completes processing, then the previously received symbols will be overwritten before being processed. In order to prevent this from occurring, known systems solve this problem by allocating a second buffer 20 to receive n symbols while the decoder processes the n symbols in buffer 10. Since the process of decoding is faster than the process of receiving symbols from a deinterleaver, by the time n symbols are received and stored in buffer 20, the decoder is again available and the symbols in buffer 20 can be processed by the decoder while buffer 10 is reallocated to receive another stream of n symbols.

SUMMARY OF THE INVENTION

The present invention provides a new arrangement for receiving and storing received symbols from a deinterleaver and decoding the received symbols. The system allocates memory for holding the received symbols, such that as symbols are received from a plurality of channels during frame periods, symbols received during previous frame periods for the plurality of channels are decoded, thereby freeing up memory holding the symbols, which have been decoded, to be re-allocated for the reception of new symbols. The system requires less buffer space than a conventional double-buffered system.

BRIEF DESCRIPTION OF THE DRAWINGS

Table 1 shows an example of buffer allocation as symbols are received for a plurality of channels over a plurality of frames.

DETAILED DESCRIPTION OF THE PREFERRED EMBODIMENTS

Figure 2:
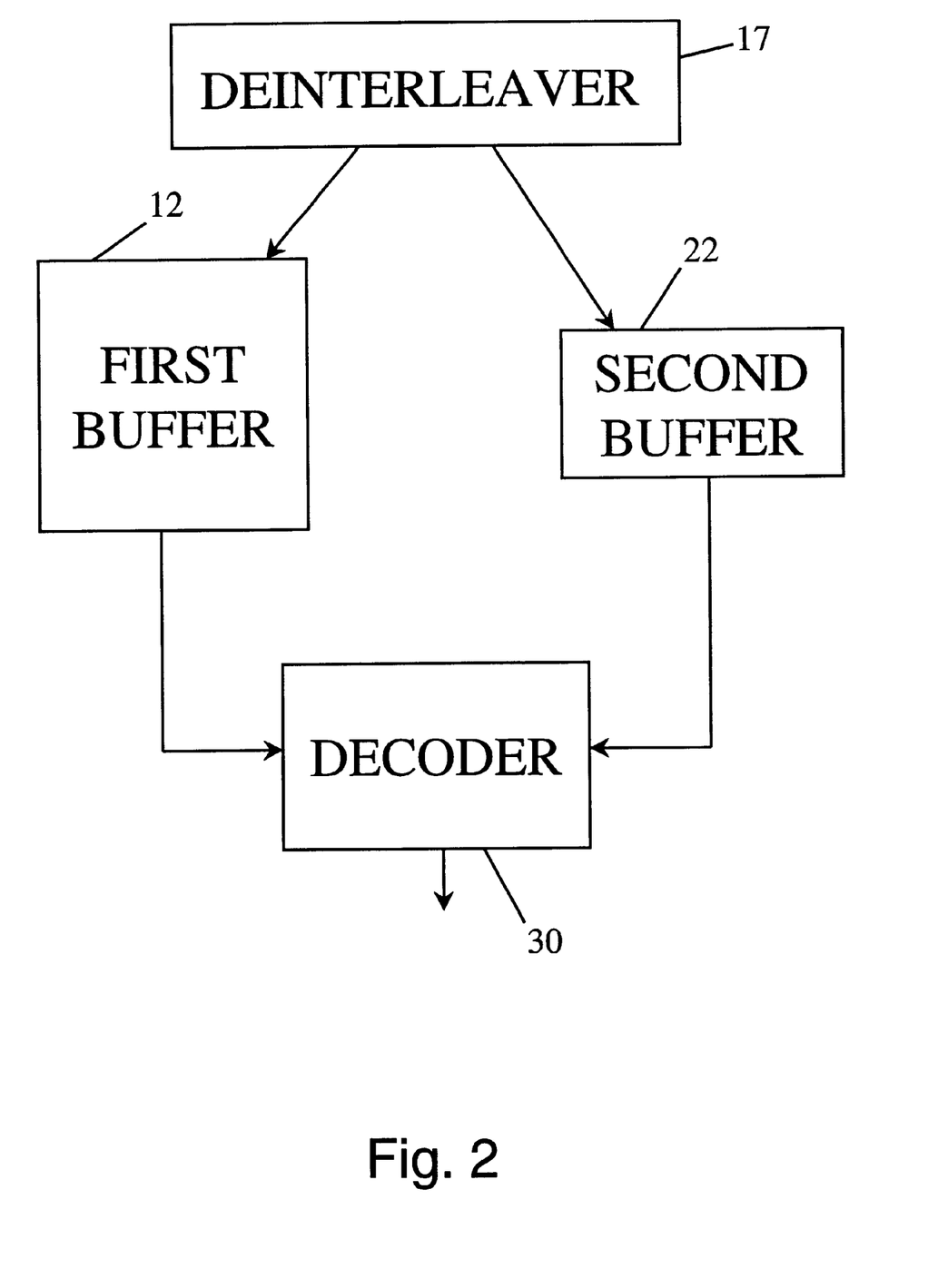
FIG. 2 shows a system for the reception of symbols from a deinterleaver, which requires less memory for the reception and decoding of frames of symbols.

Symbols are received during a time frame or, simply, a frame. Consider, for example, a system which, during a frame, receives n symbols from a deinterleaver 17 every 20 ms. The system has a decoder 30 which takes 10 ms to decode the symbols received during one frame. As illustrated in FIG. 2, after the complete first frame of symbols has been received into, for example, a buffer 12, which is capable of storing n symbols, the decoder can process the complete frame. During the 10 ms in which the decoder decodes the symbols stored in buffer 12, n/2 symbols of the next frame are received. These n/2 symbols can be stored in a second buffer 22 which has a capacity to store n/2 symbols. The remaining n/2 symbols of that frame can be stored in the first or second half of buffer 12. This can be done because the contents of buffer 12 were just decoded and no longer need to be saved. Thus, the system can operate with buffers capable of storing 1.5 frames of n symbols. This is a 25% improvement over known systems that perform double-buffering.

If the decoder processing time is different from the example above, then the storage requirement changes. For example, in a system in which frames of symbols are received every 20 ms and the decoder processing time is 15 ms, then while the decoder processes a received frame of n symbols, 15/20*n or 0.75*n symbols are received. These can be received into a second buffer having a capacity of 0.75*n symbols. In this example, the reduction in buffer space is only 12.5% over conventional systems that perform double-buffering.

Figure 3:
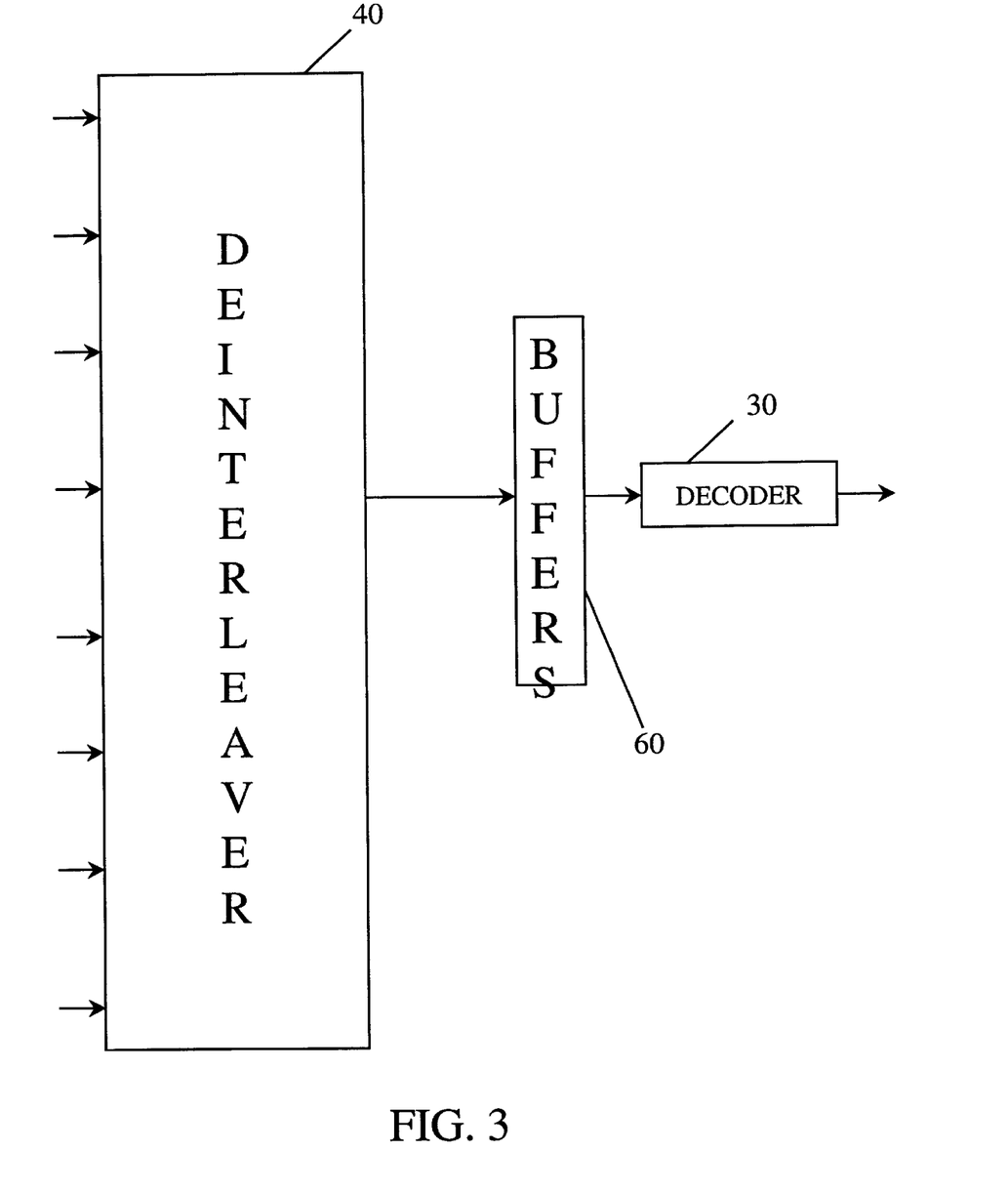
FIG. 3 shows an embodiment of the invention receiving frames of symbols for eight channels, through a deinterleaver.
Figure 4:
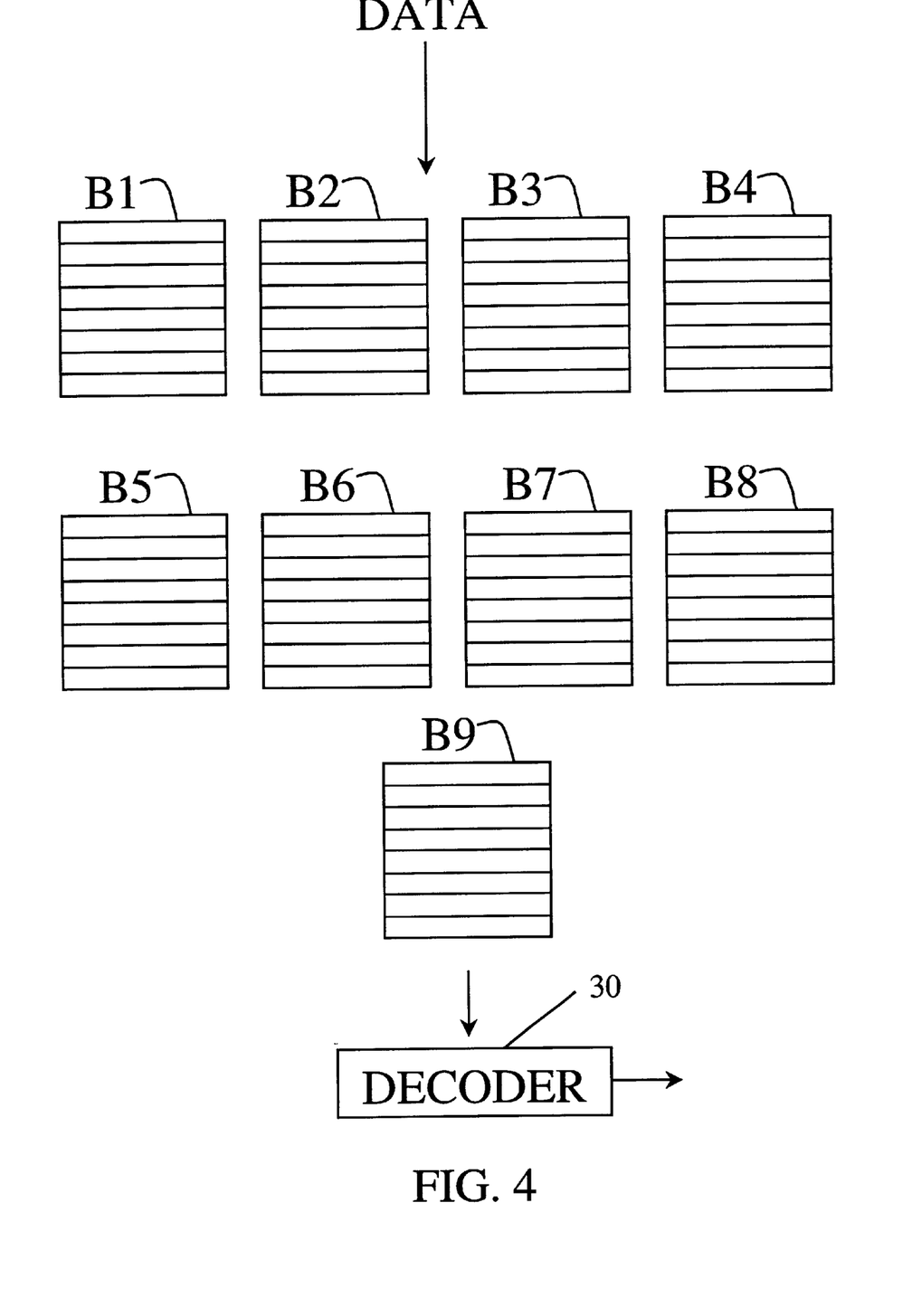
FIG. 4 shows a system for the reception of symbols into buffers, wherein the symbols are stored into chunks within buffers.

Now consider a system having x channels of symbols simultaneously received and separately processed by the decoder, perhaps serially. For example, as shown in FIG. 3, if eight streams of symbols from eight different channels are separately strobed into the deinterleaver 40, and buffered by buffers, collectively designated as buffers 60, but a single decoder 30 is used to process all eight streams in sequence, assuming that a frame is 20 ms, then the decoder must complete processing of each of the eight streams received during the frame in no more than 20/8=2.5 ms. Consequently, then during the first frame, 8 * n symbols are received and stored in eight buffers, each buffer storing n symbols. This can be, for example, buffers B1–B8 of FIG. 4. Buffer B1 stores symbols for channel 1, B2 for channel 2, B3 for channel 3, etc. While the decoder processes the first channel, n/8 symbols are received for each channel, which can be stored in a ninth buffer, for example, buffer B9 of size n. However, because the decoder has completed the processing of one frame of symbols for one channel, n memory locations in buffer B1, have become free and can then be used for receiving n symbols while the decoder processes the next channel. While the decoder processes the second channel, n/8 symbols are received for each channel and stored in, for example buffer B1. Once the decoder is finished with the eighth channel of symbols, stored in B8, buffers B1 through B7 and B9 are filled. However, each buffer does not contain a single channel's symbols. Because the channels were received in n/8 symbol size pieces, or chunks, the data for a channel is contained in eight such chunks, spread across eight buffers. Therefore, at this point, each of buffers B1 through B7 and B9 contain symbols for each of the eight channels, each channel's symbols being stored in one of the eight chunks of each buffer. As the decoder processes the channels, new symbols will be received and stored into the chunks as they become available. Using this scenario, it would only be necessary to buffer 9*n symbols of storage, instead of the 16*n that would be required when using double buffering, thereby requiring 43.75% less memory than a double-buffering system. The difficulty here is that the system is actually managing 9*8 or 72 buffers.

A "resource allocator" can be used to allocate chunks used for symbol storage. As the decoder completes processing of symbols (either on a per channel basis, or a per chunk basis), it can free up the chunks storing the decoded symbols, so that they may be reused by the resource allocator. If the system uses x channels and n symbols per channel per frame, then x*(x+1) chunks of memory must be available. The resource allocator can utilize an x*(x+1) bit map, in which each bit of 0 indicates a corresponding available chunk, and each bit of 1 indicates a corresponding used chunk. Thus, whenever a chunk is allocated, the first free chunk is provided and its corresponding bit in the bit map is set. Whenever the chunk is freed, its corresponding bit in the bit map is reset to 0.

The preferred embodiment supports IS95B, which is a recognized standard. IS95B is described in "TR45 Mobile Station-Base Station Compatibility Standard for Dual-Mode Wideband Spread Spectrum Cellular Systems", Ballot Version, TLA/EIA/SP-3693 to be known as TIA/EIA-95, Nov. 18, 1997, and is incorporated herein by reference.

This embodiment includes a fundamental channel and seven supplemental channels. The fundamental channel takes longer to decode than each of the supplemental channels. A maximum number of eight channels of 384 symbols per frame are received by the deinterleavers. Therefore, for the sake of simplicity, we assume that 384 symbols are received for each channel during a frame.

Figure 5:
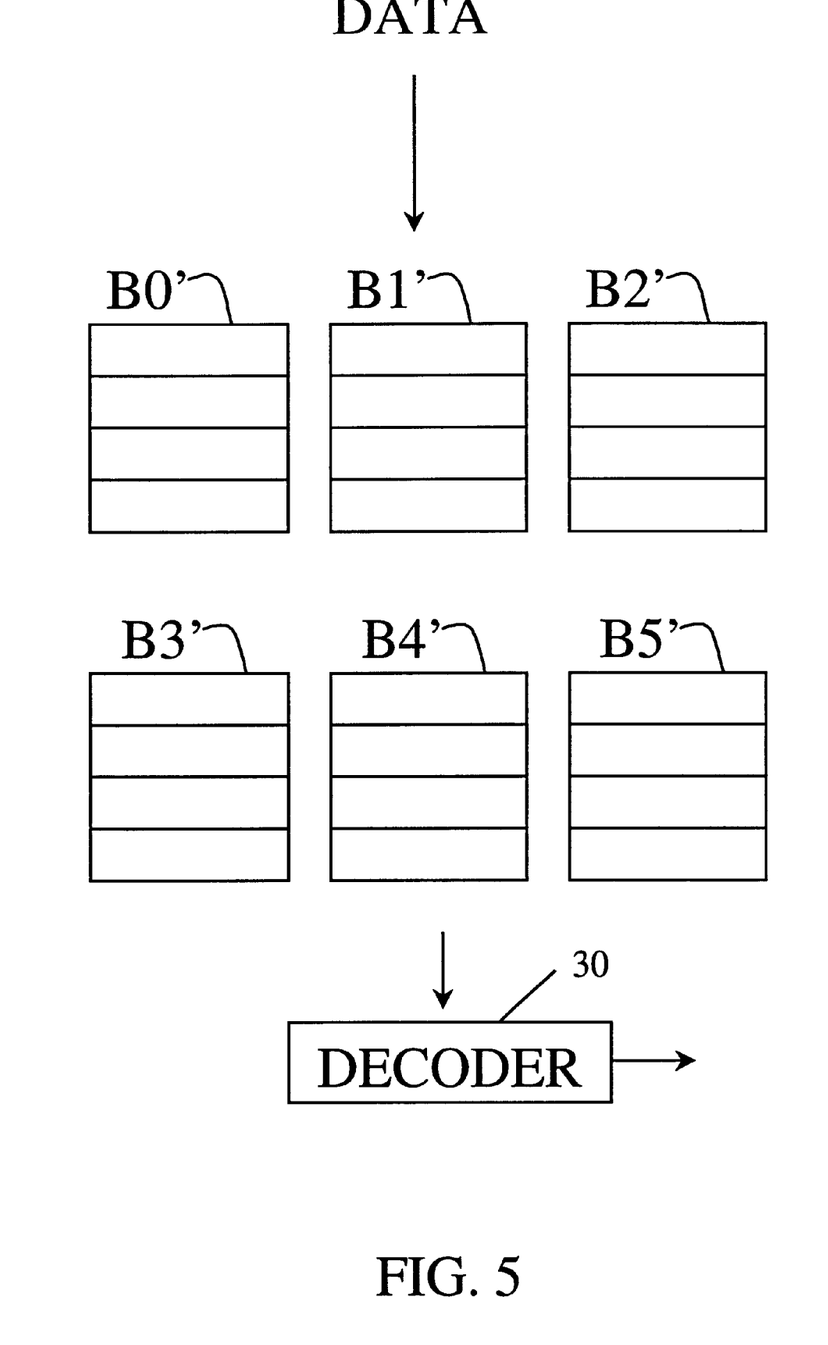
FIG. 5 shows a preferred embodiment receiving symbols into 6 buffers, each buffer being divided into four chunks.

Each decoded channel frees storage space for 384 symbols. If the chunk size is 192 symbols and the buffer size is four chunks, then four buffers, or 16 chunks are required to store eight channels of one frame of symbols. While decoding the fundamental channel, data can be stored into eight additional chunks, but two chunks would free up after decoding a channel. This scheme requires twenty-four chunks of memory, enough to store 4,608 symbols. The actual number of buffers required is six, each having four chunks, as shown in FIG. 5.

Table 1 helps to explain how buffers are allocated using the above scheme. As explained above, each buffer is divided into four chunks, each having a 192 symbol capacity. First, the first half of frame 0, channels 0–3 and 4–7 are received, into buffers B0' and B1', respectively. That is, the first half of frame 0, channels 0–3 are stored into four chunks, respectively, in buffer B0' and the first half of frame 0, channels 4–7 are stored into four chunks, respectively, in buffer B1'.

Next, the second half of frame 0, channels 0–3 are stored into four chunks, respectively, in buffer B2' and the second half of frame 0, channels 4–7 are stored into four chunks, respectively, in buffer B3'. After a frame of symbols is completely received, the frame of symbols can be decoded. Therefore, as frame 1 is received, the first half of frame 1, channels 0–3 and 4–7 are stored in buffers B4' and B5', respectively, while frame 0, channels 0–3 are decoded, freeing up buffers B0' and B2'. When the second half of frame 1, is received, the second half of channels 0–3 are stored in newly available buffer B0' and the second half of channels 4–7 are stored in newly available buffer B2'. Meanwhile the first and second halves of frame 0, channels 4–7 are decoded, freeing up buffers B1' and B3'.

During frame 2, the first half frame of symbols for channels 0–3 and 4–7 are stored in buffers B1' and B3', respectively, while the first and second halves of frame 1, channels 0–3 are decoded, freeing up buffers BO' and B4'. Next, the second half of frame 2, channels 0–3 and 4–7 are received into buffers B4 and B0, respectively, while frame 1, channels 4–7 are decoded, freeing up buffers B2' and B5'.

As the first half of frame 3, channels 0–3 and 4–7 are received, they are stored in buffers B5' and B2', respectively, while frame 2, channels 0–3 are decoded, freeing up buffers B1' and B4'. When the second half of frame 3, channels 0–3 and 4–7 are received, they are stored, respectively, in buffer B1' and B4', while frame 2, channels 4–7 are decoded, freeing up buffers B0' and B3'.

As the first half of frame 4, channels 0–3 and 4–7 are received, they are stored in buffers B3' and B0', respectively, while frame 3, channels 0–3 are decoded, freeing up buffer B1' and B5'. When the second half of frame 4, channels 0–3 and 4–7 are received, they are stored, respectively, in buffers B5' and B1', while frame 3, channels 4–7 are decoded, freeing up buffers B2' and B4'.

As the first half of frame 5, channels 0–3 and 4–7 are received, they are stored in buffers B2' and B4', respectively, while frame 4, channels 0–3 are decoded, freeing up buffer B3' and B5'. When the second half of frame 5, channels 0–3 and 4–7 are received, they are stored, respectively, in buffer B3' and B5', respectively, while frame 4, channels 4–7 are decoded, freeing up buffers B0' and B1'.

As the first half of frame 6, channels 0–3 and 4–7 are received, they are stored in buffers B0' and B1', respectively, while frame 5, channels 0–3 are decoded, freeing up buffers B2' and B3'. When the second half of frame 6, channels 0–3 and 4–7 are received, they are stored, respectively, in buffers B2' and B3', while frame 5, channels 4–7 are decoded, freeing up buffers B4' and B5'. Note that the buffer allocation pattern for frame 6 is a repeat of the pattern for frame 0, except that the pattern of frame 6 assumes that a previous frame of data was received.

As can be seen from examining Table 1, one can easily determine which buffer in which to store the symbols if one maintains a four-bit counter which is incremented, for example, every 10 ms, and if one knows whether the symbols are for channels 0–3 or 4–7.

Similarly, as can be seen from Table 1, one can easily determine which buffer should be read by the decoder if one maintains a four-bit counter which is incremented, for example, every 10 ms, if one knows whether the symbols are for channels 0–3 or 4–7, and if one knows whether to read the first or second half of the frames for the channel set.

As illustrated above, one can easily determine which buffer from which to read or to which to write based on knowing the channel set (0–3 or 4–7), whether a read or a write operation is to be performed, and whether the first or second half-frames are to be received into buffers or are to be read from buffers. One of ordinary skill in the art would know how to represent Table 1 in a memory device and how to provide an indication of which buffer to access based on the above-mentioned inputs.

Figure 6:
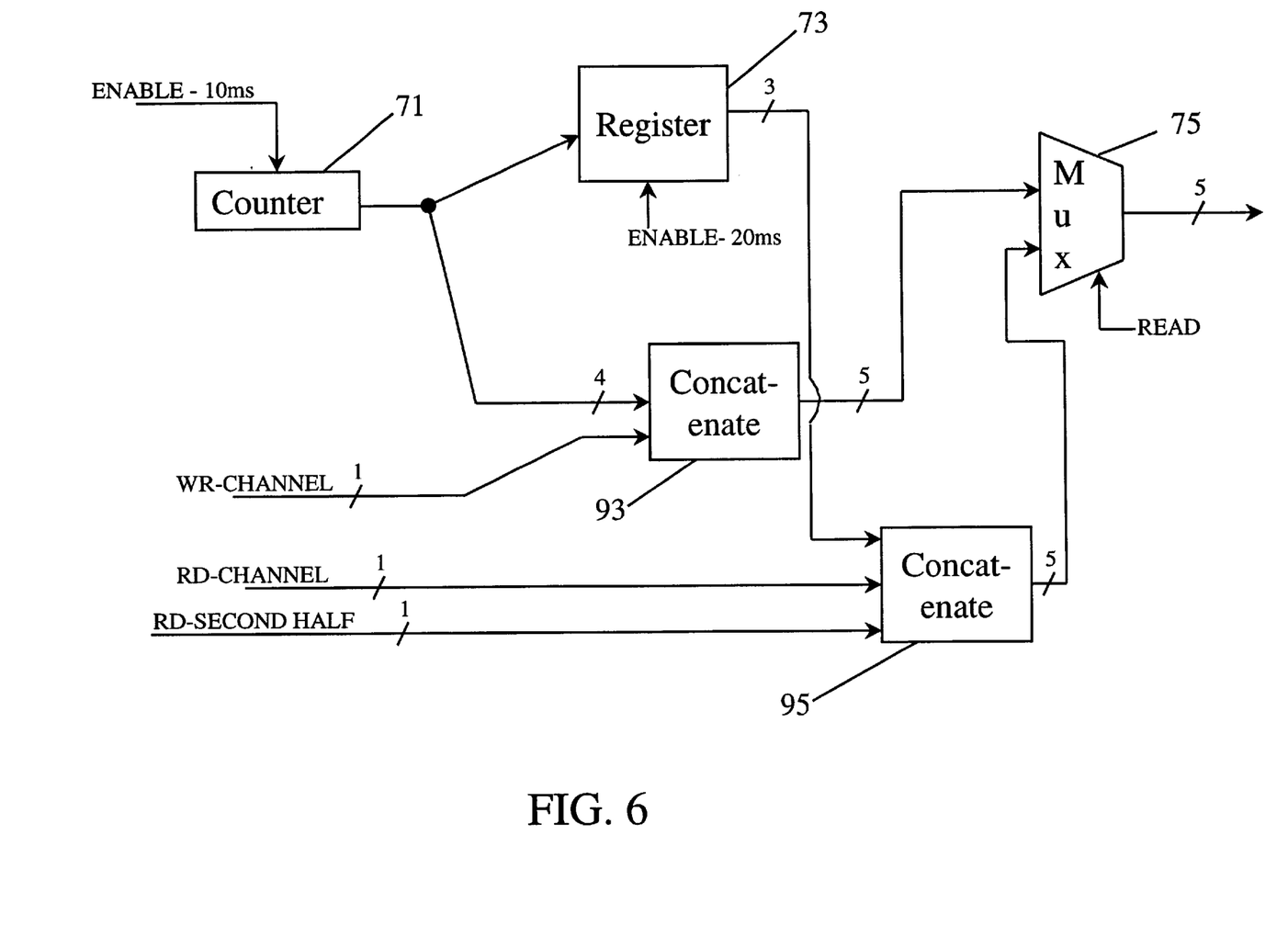
FIG. 6 shows an example of hardware for implementing the scheme described in Table 1.

FIG. 6 is an example of hardware which provides the above information needed to determine from which buffer to read and to which buffer to store the half frames of symbols. For example, counter 71 is a four-bit modulo-12 counter. An enable signal is set every 10 ms to cause the counter 71 to increment every half-frame time period. Thus, counter 71 increments, every 10 ms, within the range of 0–11. The three most significant bits of counter 71 are latched into register 73 every 20 ms, just before counter 71 is incremented. Thus, the register 73 holds the previous frame number.

Concatenater 95 receives the three-bit output of register 73, indicating the frame number. RD-CHANNEL is a one-bit signal from a counter (not shown) used by the decoder to keep track of the channel being decoded. When RD-CHANNEL is 0, channels 0–3 are indicated, otherwise, channels 4–7 are indicated. RD-SECOND HALF is a one-bit signal from the decoder indicating whether the first or second half of the frame of symbols are to be read. Concatenater 95 receives the three inputs and concatenates them into a five-bit output, which is supplied to multiplexor 75. When the READ signal, supplied to multiplexor 75 is 1, the output of concatenater 95 is output from multiplexor 75.

Concatenater 93 receives the four-bit signal from counter 71. A one-bit signal, WR-CHANNEL, is input to concatenater 93 indicating whether the information to be stored pertains to channels 0–3 (value 0) or 4–7 (value 1). WR-CHANNEL is derived from the most significant bit of a three-bit channel ID number. The two signals are concatenated by concatenater 93 and output as a five-bit signal to multiplexor 75. Multiplexor 75 outputs the five-bit signal when the READ signal is 0.

As can easily be seen, if READ is low, indicating a write operation into a buffer, and if the counter 71 is 0011, and WR-CHANNEL is high or 1, then the output of concatenater 93 indicates frame 1, second half frame, and channel set 4–7. Thus it can be determined that the second half frame of symbols for channels 4–7 in frame 1 are to be stored in buffer 2' (see Table 1).

Similarly, assume the register 73 has the value 001, RD-SECOND HALF is high or 1, READ is high, indicating a read operation, and RD-CHANNEL is high. The output of concatenater 95 indicates frame 1, second half, and channel set 4–7. It can easily be determined that buffer 3' is to be read.

Preferably, register 73 of FIG. 6 is a "subtract by 1" block. In this preferred embodiment, the upper three bits of counter 71 enter the "subtract by 1" block and the output of the "subtract by 1" block is simply the input value less 1. However, it is important to note that because the upper three bits of counter 71 are in a range of 0 to 5, the output of the "subtract by 1" block is in a range of −1 to 4. Therefore, the value −1 in the "subtract by 1" block must be mapped to the value 5. Otherwise this alternate embodiment is identical to that shown in FIG. 6.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims. Furthermore, although the invention uses buffers to store symbols, the buffers may be part of a single memory or multiple memories. In addition, the buffers may be included in one or more memories within at least one deinterleaver or separate from the deinterleaver.

What is claimed is:

1. A method of reducing memory requirements in a system including at least one deinterleaver and a decoder, said system being constructed and arranged to receive a plurality of symbols for a plurality of channels, said method comprising:

making a plurality of buffers in a memory available for receiving said symbols, each of said buffers including a plurality of chunks, each chunk having a minimum of n/x locations, where n represents a number of symbols in a frame period and x represents a number of channels;

receiving and storing at least a portion of the symbols from the frame period for at least some of said plurality of channels into corresponding ones of said chunks, each of said corresponding ones of said chunks storing symbols of only a corresponding one of said channels;

decoding said symbols received during frame periods for said at least some of said plurality of channels after said symbols are stored into said chunks during complete ones of said frame periods; and making said chunks, which store said decoded symbols, available for receiving additional symbols.

2. A method according to claim 1, wherein a total amount of capacity of said buffers for storing said received symbols for said channels is less than a total amount of capacity of said buffers required to store two complete ones of said frame periods of symbols for all of said channels.

3. A method according to claim 1, wherein decoding said symbols received during said frame periods is performed serially.

4. A method according to claim 1, wherein a number of said plurality of said channels is eight channels.

5. A method according to claim 1, wherein a number of chunks, having a total cumulative capacity of 384 symbols, is made available for storing said additional symbols for each of said channels decoded during each of said frame periods.

6. A method according to claim 1, wherein each of said chunks has a capacity to store 192 symbols.

7. A combination, including at least one deinterleaver and a decoder, constructed and arranged to receive a plurality of symbols for a plurality of channels, said combination comprising:

at least one memory including a plurality of buffer areas available for receiving said symbols, each of said buffer areas including a plurality of chunks, each chunk having a minimum of n/x locations, where n represents a number of symbols in a frame period and x represents a number of channels;

means for receiving and storing said symbols, received during at least a portion of frame periods, for at least some of said plurality of channels into corresponding ones of said chunks, each of said corresponding ones of said chunks storing symbols of only a corresponding one of said channels;

means for decoding said symbols for said at least some of said plurality of channels after said symbols for said at least some of said plurality of channels are received into said chunks during complete ones of said frame periods; and means for making said chunks, which store said decoded symbols, available for receiving additional symbols.

8. A combination according to claim 7, wherein a total amount of capacity of said buffer areas for storing said received plurality of symbols for said plurality of channels is less than a total amount of capacity of said buffer areas required to store said symbols for two complete frame periods for all of said channels.

9. A combination according to claim 7, wherein said decoding means is arranged to decode said symbols serially.

10. A combination according to claim 7, wherein a number of said channels is eight channels.

11. A combination according to claim 7, wherein a number of chunks, having a total cumulative capacity of 384 symbols, is made available for storing said additional symbols for each of said channels decoded during each of said frame periods.

12. A combination according to claim 7, wherein each of said chunks has a capacity to store 192 symbols.

13. A combination constructed and arranged to receive a plurality of symbols for a plurality of channels, comprising:

at least one memory including a plurality of buffer areas available for receiving said symbols, each of said buffer areas including a plurality of chunks, each chunk having a minimum of n/x locations, where n represents a number of symbols in a frame period and x represents a number of channels;

at least one deinterleaver being arranged to receive said symbols, for at least some of said plurality of channels, during at least a portion of frame periods, said at least one deinterleaver being arranged to store said received symbols into corresponding ones of said chunks, each of said corresponding ones of said chunks storing symbols of only a corresponding one of said channels;

a decoder being arranged to decode said symbols for said at least some of said plurality of channels after said symbols for said at least some of said plurality of channels are received into said chunks from said at least one deinterleaver during complete ones of said frame periods; and means for making said chunks, which store said decoded symbols, available for receiving additional symbols.

14. A combination according to claim 13, wherein a total amount of capacity of said buffer areas for storing said received plurality of symbols for said plurality of channels is less than a total amount of capacity of said buffer areas required to store said symbols for two complete frame periods for all of said channels.

15. A combination according to claim 13, wherein said decoder is arranged to decode said symbols serially.

16. A combination according to claim 13, wherein a number of said channels is eight channels.

17. A combination according to claim 13, wherein a number of chunks, having a total cumulative capacity of 384 symbols, is made available for storing said additional symbols for each of said channels decoded during each of said frame periods.

18. A combination according to claim 13, wherein each of said chunks has a capacity to store 192 symbols.

19. A combination according to claim 13, further including control circuitry, said control circuitry comprising:

a counter comprising at least four bits, said counter being arranged to be incremented every first predetermined time interval;

a register arranged to receive at least three bits of said at least four bits of said counter, said at least three bits of said counter indicating a particular frame period, said register being enabled to receive said at least three bits every second predetermined time period, said second predetermined time period being larger than said first predetermined time period;

a first concatenater arranged to receive said at least three bits from said register, a RDChannel indicator, arranged to provide an indication of at least a portion of a channel number to be read by said decoder, and a RD-Second half indicator from said decoder, said RD-Second half indicator being arranged to provide an indication of whether a first or a second half of a frame of symbols is to be read;

a second concatenater arranged to receive said at least four bits from said counter during each of said first predetermined time periods and a WR-Channel indicator, arranged to provide an indication of a channel number corresponding to at least one channel being received; and a multiplexer arranged to receive an output from said first concatenater and an output from said second concatenater, said multiplexer being arranged to select as an output one of said received output from said first concatenater and said received output from said second concatenater, based on a signal provided to said multiplexer.

20. A combination according to claim 13, further including control circuitry, said control circuitry comprising:

a counter comprising at least four bits, said counter being arranged to be incremented every first predetermined time interval;

a subtract-by-1 block arranged to receive at least three bits of said at least four bits of said counter, said at least three bits of said counter indicating a particular frame period;

a first concatenater arranged to receive an output from said subtract-by-1 block, a RDChannel indicator, arranged to provide an indication of at least a portion of a channel number to be read by said decoder, and a RD-Second half indicator from said decoder, said RD-Second half indicator being arranged to provide an indication of whether a first or a second half of a frame of symbols is to be read;

a second concatenater arranged to receive said at least four bits from said counter during each of said first predetermined time periods and a WR-Channel indicator, arranged to provide an indication of a channel number corresponding to at least one channel being received; and a multiplexer arranged to receive an output from said first concatenater and an output from said second concatenater, said multiplexer being arranged to select as an output one of said received output from said first concatenater and said received output from said second concatenater, based on a signal provided to said multiplexer.

21. A combination according to claim 7, further comprising:

means for identifying a buffer from which to read, from said plurality of buffers, based on a frame number and an indication of a channel number.

22. A combination according to claim 7, further comprising:

means for identifying a buffer in which to write, from said plurality of buffers, based on a frame number and an indication of a channel number.

23. A combination according to claim 13, further comprising:

means for identifying a buffer from which to read, from said plurality of buffers, based on a frame number and an indication of a channel number.

24. A combination according to claim 13, further comprising:

means for identifying a buffer to which to write, from said plurality of buffers, based on a frame number and an indication of a channel number.

* * * * *